(12) United States Patent
Ma

(10) Patent No.: US 7,588,453 B2
(45) Date of Patent: Sep. 15, 2009

(54) ZERO INSERTION FORCE CONNECTOR WITH IMPROVED DRIVING DEVICE

(75) Inventor: Hao-Yun Ma, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/283,360

(22) Filed: Sep. 10, 2008

(65) Prior Publication Data

US 2009/0068876 A1 Mar. 12, 2009

(30) Foreign Application Priority Data

Sep. 10, 2007 (TW) .............................. 96215129 U

(51) Int. Cl.
*H01R 13/625* (2006.01)
(52) U.S. Cl. ..................................... 439/342
(58) Field of Classification Search ................ 439/342, 439/372, 370, 264, 259
See application file for complete search history.

(56) References Cited

U.S. PATENT DOCUMENTS 7,371,101 B2 * 5/2008 He et al. ..................... 439/342
2005/0215102 A1 * 9/2005 Yu et al. ..................... 439/342
2006/0141841 A1 * 6/2006 Liao et al. ................... 439/342
2008/0102681 A1 * 5/2008 Ma ............................ 439/342
2008/0108239 A1 * 5/2008 Ma ............................ 439/259
2008/0280473 A1 * 11/2008 Zhou et al. ................... 439/259
2008/0311777 A1 * 12/2008 Liao ........................... 439/342

* cited by examiner

*Primary Examiner*—Neil Abrams
*Assistant Examiner*—Phuong Nguyen
(74) *Attorney, Agent, or Firm*—Wei Te Chung

(57) ABSTRACT

An electrical connector of the present invention includes a base unit (10) mounting a plurality of terminals therein, a cover unit (11) assembled on the base unit and defining a receiving room (134) therein facing the base unit (10), and a driving device (12) received in the receiving room (134) and connecting with the base unit (10) and cover unit (11). The driving device comprises a driving member (14) and a whirling member (16). A receiving space (157) is defined between one end of the whirling member (16) and the cover unit (11) for receiving part of the driving member (14), and the other end of the whirling member (16) is engaging with the cover unit (11).

8 Claims, 6 Drawing Sheets

ZERO INSERTION FORCE CONNECTOR WITH IMPROVED DRIVING DEVICE

BACKGROUND OF THE INVENTION

1. Field of the Invention

The present invention relates to a zero insertion force (ZIF) connector, and particularly to a socket connector having a driving device for urging a cover to slide on a base thereof.

2. Description of the Prior Art

U.S. patent application Ser. No. 11/983,020, filed on Nov. 5, 2007, which is assigned to a same assignee of this invention discloses a socket connector for connecting an IC package such as a CPU to a printed circuit board (PCB). The socket connector comprises an insulating base 10' arranged a plurality of terminals therein, a cover 11' assembled on the base 10' and a driving device actuating the cover to slide on the insulating base. The driving device comprises a driver member 14', a retaining member 15' and a whirling member 16'. The retaining member 15' is fixed in the cover 11' and comprises a bending plate 151' bent downwardly to urge with the whirling member. The driving member 14' is in a cam like and comprises an operating portion 140' and a brim portion 142' at its end. A locking portion 141' is locked with the whirling member 16' so as to drive the whirling member to move forward and backward. When the driving member 14' is rotated, the whiling member 16' will actuate the cover 11' to slide relatively to the base 10'. As the brim portion is sandwiched between the flatness retaining member 15' and whiling member 16', a large moment will be produced between the locking portion 141' and bending plate 151', therefore the user needs a large force to actuate the cover 11' moving on the base 10'. Hence, a new design which can reduce operating force is required.

SUMMARY OF THE INVENTION

Accordingly, an object of the present invention is to provide a socket connector with an improved retaining portion.

In order to achieve the object set forth, a socket connector comprises: a base unit mounting a plurality of terminals therein; a cover unit assembled on the base unit and defining a receiving room therein facing the base unit; and a driving device received in the receiving room and connecting with the base unit and cover unit, comprising a driving member and a whirling member; wherein a receiving space is defined between one end of the whirling member and the cover unit for receiving part of the driving member, and the other end of the whirling member is engaging with the cover unit.

Other objects, advantages and novel features of the invention will become more apparent from the following detailed description of the present embodiment when taken in conjunction with the accompanying drawings.

DETAILED DESCRIPTION OF THE INVENTION

Figure 1:
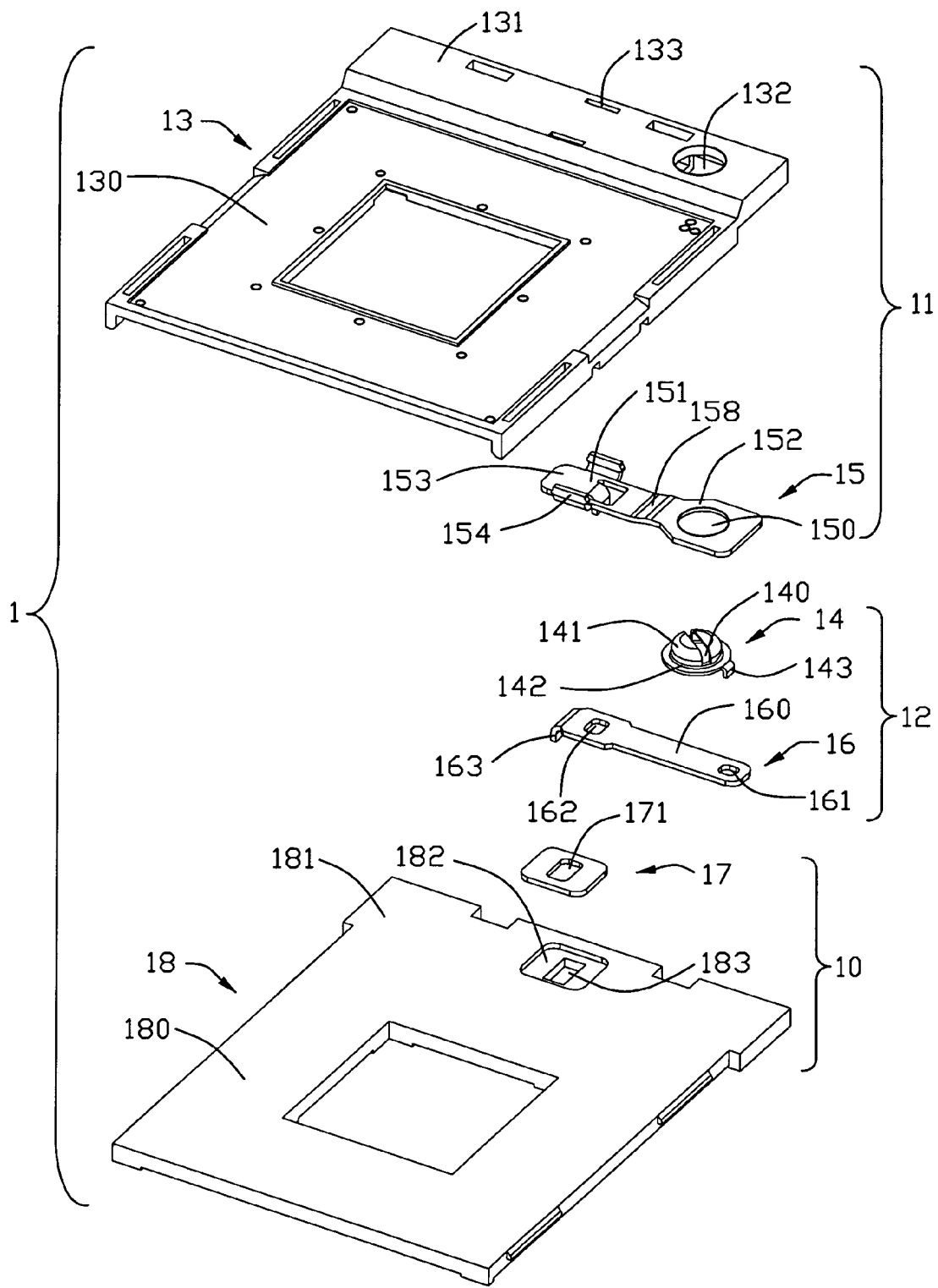
FIG. 1 is an exploded perspective view of a socket connector in accordance with the present invention.

Reference will now be made to the drawing figures to describe a preferred embodiment of the present invention in detail.

Figure 2:
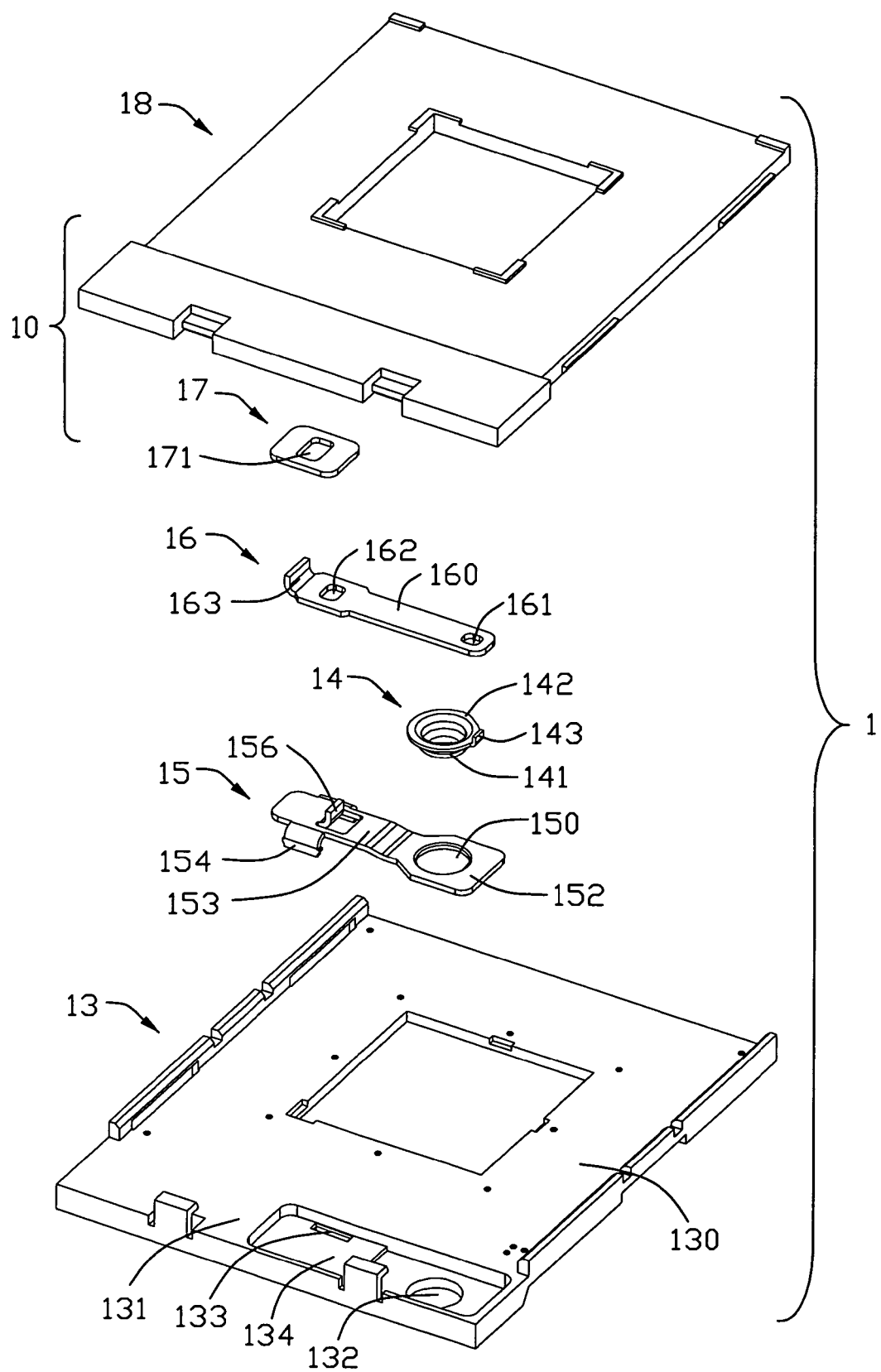
FIG. 2 is another exploded perspective view of the socket connector shown in FIG. 1.

Referring to FIGS. 1 and 2, a ZIF socket connector in accordance with the present invention is adapted for electrically connecting an IC package such as a CPU to a PCB (not shown). The ZIF socket connector 1 comprises a base unit 10 mounting a plurality of terminals (not shown) thereon, a cover unit 11 moveable assembled on the base unit 10 and a driver device 12 locating between the base unit 10 and the cover unit 11.

As shown in FIG. 1, the base unit 10 comprises an insulating base 18 and a metallic second retaining plate 17. The base 18 has a rectangular shape and comprises a base portion 180 with a plurality of conductive terminals (not shown) received therein and a supporting portion 181 extending forward from one end of the base portion 180. A shallow receiving recess 182 of a foursquare shape is defined in the supporting portion 181 with a rectangular slot 183 therein. The metallic second retaining plate 17 is received in the recess 182 with a hole 171 defined in a middle portion.

The cover unit 11 comprises a cover 13 and a first retaining plate 15 retained under the cover 13. The cover comprises a main body 130 and a head portion 131 extending from one end of the main body 130. A pair of transverse grooves 133 is respectively defined in the middle portion of the head portion 131. At one side of a bottom portion of the head portion 131, a receiving room 134 is defined to receive the first retaining plate 15 and the driving device 12. A circle opening 132 is defined on the head portion 131 communicating with the receiving room 134. The first retaining plate 15 comprises an elongated main body 151 comprising a first engaging portion 153 and a second engaging portion 152. The first and second engaging portions 153, 152 of the main body 151 are defined in different levels and forms a step portion 158 therebetween. A pair of bending portions 154 are formed on the first engaging portion 153 and respectively received in the transverse grooves 133. A holding plate 156 is formed between the bending portions 154 and bending downward. A circle opening 150 is defined on the second engaging portion 152 corresponding with the opening 132 on the head portion 131.

The driving device 12 is received in the receiving room 134 and comprises a driving member 14 and a whirling member 16. The driving member 14 is in a cap like and comprises a calotte operating portion 141 defining a transverse slot 140 in a middle portion, and a circinal brim portion 142 expanding outward and downward at the end of the operating portion. A locking portion 143 extends outward and then downward from an edge of the brim portion 142, which forms an adverse L shape. The whirling member 16 comprises an elongated main body 160 and a retaining portion 163 extending downward at one distal end. A pair of apertures 161, 162 is respectively defined at opposite ends of the main body 160.

Figure 3:
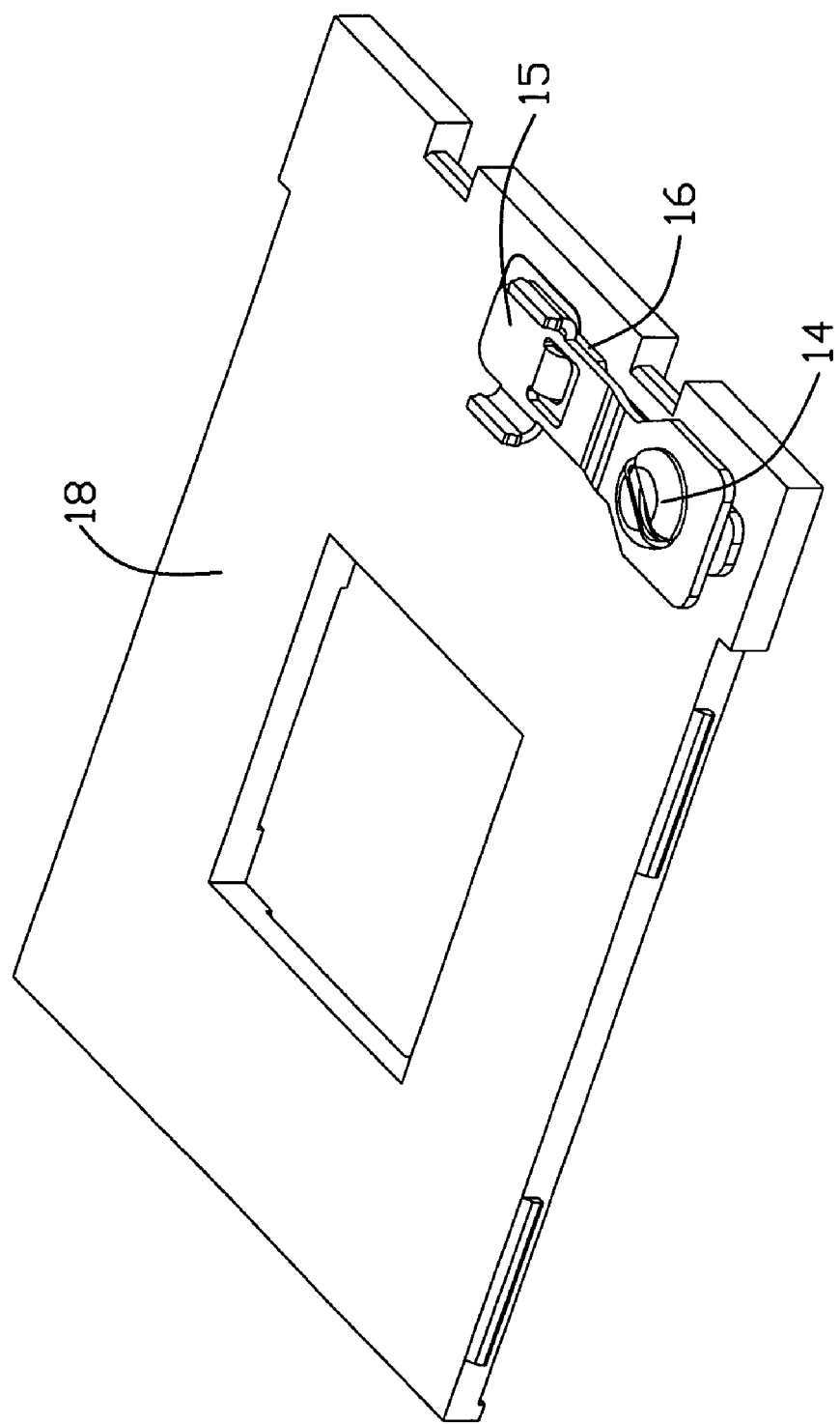
FIG. 3 is an assembled perspective view of a driving device assembled on an insulating base of the socket connector shown in FIG. 1.

The retaining portion 163 of the whirling member 16 is inserted into the hole 171 and slot 183 defined on the base unit 10 so as to engage with the base 18. The locking portion 143 of the driving member 14 is inserted into the aperture 161 opposite the retaining portion 163, and the operating portion 141 projecting outward of the circle opening 150 of the first retaining member 15 with brim portion 142 sandwiched between the first retaining member 15 and whirling member 16. Moreover, the holding plate 156 is inserted into the aperture 162 on the whirling member 16. FIG. 3 shows that the driving device 12 is mounted on the base unit 10 with the first retaining member 15 assembled thereon.

Figure 4:
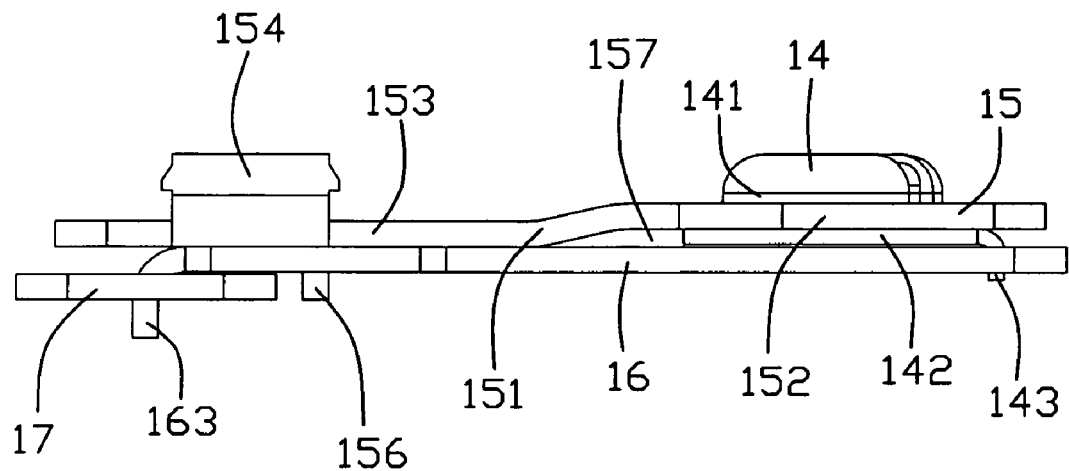
FIG. 4 is an assembled perspective view of the driving device of the socket connector shown in FIG. 3.
Figure 5:
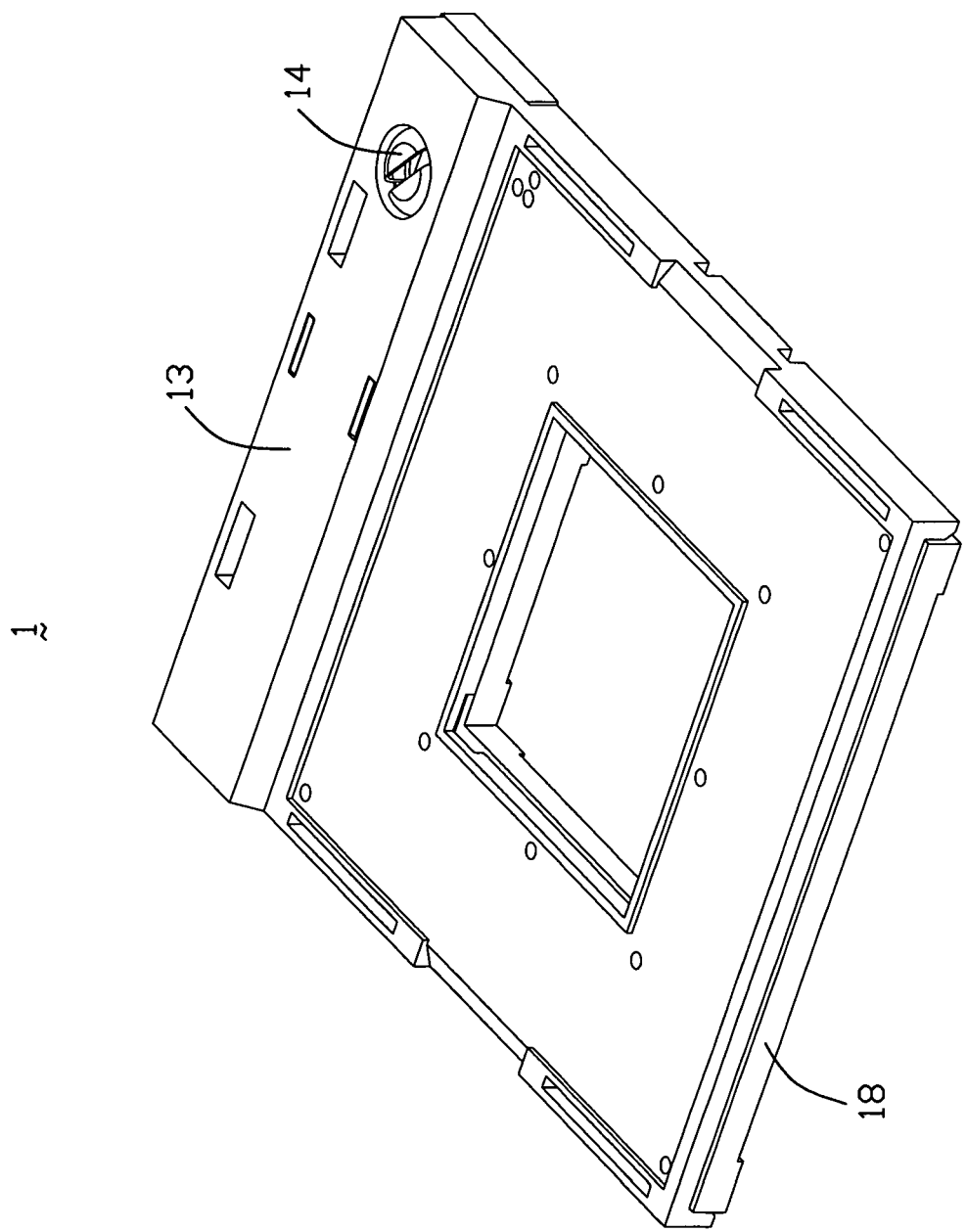
FIG. 5 is an assembled perspective view of the socket connector shown in FIG. 1.
Figure 6:
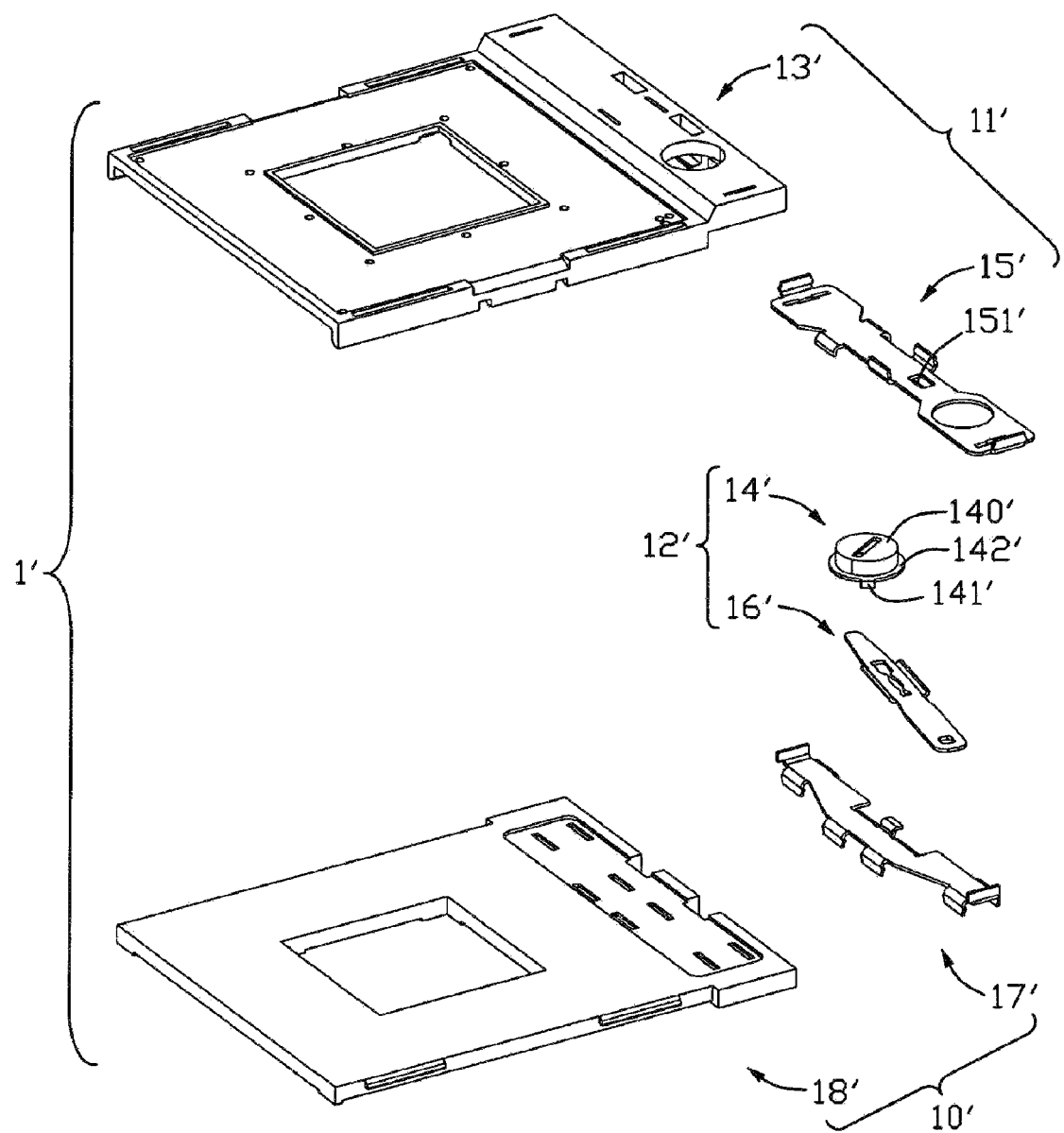
FIG. 6 is an exploded perspective view of a socket connector of a prior art.

Referring to FIGS. 4 and 5, the second engaging portion 152 of the first retaining member 15 is higher than the first engaging portion 153, therefore a receiving space 157 is defined between the first retaining member 15 and the whirling member 16 for receiving the brim portion 142 of the driving member 14. When the driving member 14 is rotated by the user, it will actuate the whirling member 16, therefore a driving force is concentrate on a root portion of the holding portion 156, and the moment on the holding portion 156 is reduced and the cover unit 11 is easily to be actuated.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A socket connector for connecting an IC package to a printed circuit board, comprising:
    a base unit mounting a plurality of terminals therein;
    a cover unit assembled on the base unit and defining a receiving room therein facing the base unit, the cover unit comprises an insulating cover and a first retaining plate retained in the insulating cover;
    the first retaining plate comprises an elongated main body having a first region and a second region, the first and second regions of the main body are defined in different levels and forms a step portion therebetween;
    a driving device received in the receiving room and connecting with the base unit and cover unit, said driving device comprising a rotatable driving member and a rotatable whirling member, said whirling member defining opposite first and second areas corresponding to said opposite first and second regions; and
    wherein a receiving space is defined between one end of the whirling member and the cover unit for receiving part of the driving member, and the other end of the whirling member is engaging with the cover unit;
    the first region and the first area are directly engaged with each other in a front-to-back direction to have said first region and said first area move together in said front-to-back direction while the second region and the second area are not directly engaged with each other in said front-to-back direction but via the driving member, under a condition that a gap in a vertical direction between the first region and said first area is smaller than that between the second region and said second area.

2. The socket connector as described in claim 1, wherein the driving member comprises an operating portion and a brim portion.

3. The socket connector as described in claim 2, wherein the operating portion is received in the cover unit and a brim portion is sandwiched between the cover unit and the whirling member.

4. The socket connector as described in claim 3, wherein a holding portion is formed in the first region of the first retaining plate and inserted into a first aperture defined on one end of the whirling member.

5. The socket connector as described in claim 4, wherein the brim portion is retained between the second region and the whirling member and defines a locking portion inserted into a second aperture defined on the other end of the whirling member.

6. The socket connector as described in claim 5, wherein the whirling member comprises a holding portion at one distal end near the second aperture, the holding portion is inserted into the base unit.

7. The socket connector as described in claim 6, wherein the base unit comprises an insulating base and a second retaining plate retained in the insulating base.

8. A socket connector for connecting an IC package to a printed circuit board, comprising:
    an insulative base unit mounting a plurality of terminals therein;
    an insulative cover unit assembled on the base unit and defining a receiving room therein facing the base unit;
    a metallic retention plate fasted to the cover and located between the cover and the base, the first retaining plate comprises an elongated main body having a first region and a second region, the first and second regions of the main body are defined in different levels and forms a step portion therebetween; and
    a driving device received in the receiving room and connecting with the base unit and cover unit, said driving device comprising a rotatable driving member and a rotatable whirling member, said whirling member defining opposite first and second areas corresponding to said opposite first and second regions; wherein
    the first region and the first area are directly engaged with each other in a front-to-back direction to have said first region and said first area move together in said front-to-back direction while the second region and the second area are not directly engaged with each other in said front-to-back direction but via the driving member, under a condition that a gap in a vertical direction between the first region and said first area is smaller than that between the second region and said second area.

* * * * *